(12) United States Patent
Xu (10) Patent No.: US 11,895,822 B2
(45) Date of Patent: Feb. 6, 2024

(54) MEMORY STRUCTURE AND FORMING METHOD THEREOF

(71) Applicant: CHANGXIN MEMORY TECHNOLOGIES, INC., Hefei (CN)

(72) Inventor: Yachao Xu, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 412 days.

(21) Appl. No.: 17/435,640

(22) PCT Filed: Apr. 12, 2021

(86) PCT No.: PCT/CN2021/086459
§ 371 (c)(1),
(2) Date: Sep. 1, 2021

(87) PCT Pub. No.: WO2021/208833
PCT Pub. Date: Oct. 21, 2021

(65) Prior Publication Data
US 2023/0103424 A1    Apr. 6, 2023

(30) Foreign Application Priority Data
Apr. 16, 2020    (CN) .......................... 202010299480.1

(51) Int. Cl.
*H10B 12/00*    (2023.01)

(52) U.S. Cl.
CPC ......... *H10B 12/315* (2023.02); *H10B 12/033* (2023.02); *H10B 12/05* (2023.02); *H10B 12/482* (2023.02)

(58) Field of Classification Search
None
See application file for complete search history.

(56) References Cited

U.S. PATENT DOCUMENTS

| 6,274,453 B1 | 8/2001 | Schlosser et al. |
| 7,098,478 B2 | 8/2006 | Takaura et al. |
| (Continued) | | |

FOREIGN PATENT DOCUMENTS

| CN | 1434515 A | 8/2003 |
| CN | 102522407 A | 6/2012 |
| (Continued) | | |

OTHER PUBLICATIONS

First CN Office Action cited in CN 202010299480.1, dated Jun. 9, 2023, 9 pages.

(Continued)

*Primary Examiner* — Bilkis Jahan
(74) *Attorney, Agent, or Firm* — Cooper Legal Group, LLC (57) ABSTRACT

The present disclosure relates to a memory structure and a forming method thereof. The present disclosure can improve the integration density of the memory structure. The memory structure includes: a plurality of vertical transistors, where the vertical transistors include silicon pillars; a plurality of the silicon pillars are arranged in m rows and n columns; the rows extend in a first direction and the columns extend in a second direction; m bit lines extending in the first direction and electrically connected to drains of all the vertical transistors in the same row, where the drains are located below the silicon pillars; and n word lines extending in the second direction, located in the middle of the silicon pillars, and serving as gates of all the vertical transistors in the same column, where the first direction and the second direction form a non-right angle.

13 Claims, 9 Drawing Sheets

(56) References Cited

U.S. PATENT DOCUMENTS

| | | | |
|---|---|---|---|
| 10,319,864 B2 | 6/2019 | Kim et al. | |
| 2004/0156255 A1 | 8/2004 | Tsukikawa | |
| 2006/0043617 A1 | 3/2006 | Abbott | |
| 2008/0035956 A1 | 2/2008 | Manning | |
| 2011/0049595 A1 | 3/2011 | Xiao | |
| 2013/0099305 A1* | 4/2013 | Kim | H10B 12/053 257/329 |
| 2013/0344666 A1 | 12/2013 | Moon et al. | |
| 2014/0110781 A1* | 4/2014 | Hwang | H10B 12/053 257/330 |
| 2019/0067183 A1 | 2/2019 | Liu et al. | |

FOREIGN PATENT DOCUMENTS

| | | |
|---|---|---|
| CN | 107706180 A | 2/2018 |
| CN | 108461496 A | 8/2018 |
| CN | 108493188 A | 9/2018 |
| CN | 109103193 A | 12/2018 |

OTHER PUBLICATIONS

International Search Report cited in PCT/CN2021/086459 dated Jul. 14, 2021, 8 pages.

* cited by examiner

S31 Form m × n silicon pillars arranged in m rows and n columns for subsequent formation of m × n vertical transistors, where the rows extend in a first direction and the columns extend in a second direction S32 Form m bit lines extending in the first direction and electrically connected to drains of all the vertical transistors in a same row, where the drains are provided below the silicon pillars S33 Form n word lines extending in the second direction, located in the middle of the silicon pillars, and serving as gates of all the vertical transistors in a same column

MEMORY STRUCTURE AND FORMING METHOD THEREOF

CROSS REFERENCE TO RELATED APPLICATION

This patent application claims the benefit and priority of Chinese Patent Application No. 202010299480.1, filed on Apr. 16, 2020 and entitled "MEMORY STRUCTURE AND FORMING METHOD THEREOF", the disclosure of which is incorporated by reference herein in its entirety as part of the present application.

TECHNICAL FIELD

The present disclosure relates to the memory field, in particular to a memory structure and a forming method thereof.

BACKGROUND

As the size of transistor elements continues to shrink, the manufacturing of planar transistor elements is in bottleneck. In order to overcome the limit of the manufacturing process, non-planar transistor elements such as multi-gate transistor elements and fin transistor elements to replace planar transistor elements have become the current mainstream trend.

The basic storage cell of the dynamic random access memory (DRAM) adopts a one-transistor and one-capacitor (1T1C) structure. The optimization of the transistor structure and manufacturing method will bring about an increase in the memory density. However, the current mainstream DRAM adopts a buried gate transistor structure, which restricts the increase of the storage density. Therefore, there is an urgent need for a memory cell structure that can further increase the storage density of the memory.

SUMMARY

An objective of the present disclosure is to provide a memory structure and a forming method thereof. The present disclosure can improve the integration density of the memory structure.

In order to solve the above technical problem, the present disclosure provides a memory structure. The memory structure includes: a plurality of vertical transistors, the vertical transistors include silicon pillars; a plurality of the silicon pillars are arranged in m rows and n columns; the rows extend in a first direction and the columns extend in a second direction; m bit lines, extending in the first direction and electrically connected to drains of all the vertical transistors in a same row, the drains are located below the silicon pillars; and n word lines, extending in the second direction, located in the middle of the silicon pillars, and serving as gates of all the vertical transistors in a same column, the first direction and the second direction form a non-right angle.

Optionally, an angle between the first direction and the second direction ranges from 45° to 75°.

Optionally, an angle between the first direction and the second direction is 60°.

Optionally, the vertical transistor comprises at least one of an NMOS transistor and a PMOS transistor.

Optionally, the word line is made of one of group consisting of tungsten, titanium nitride and polycrystalline silicon, or is made of a combination of tungsten, titanium nitride and polycrystalline silicon.

Optionally, the bit line may be electrically connected to the drain through a bit line contact structure; the bit line is made of one of tungsten, titanium nitride and polycrystalline silicon, or is made of a combination of tungsten, titanium nitride and polycrystalline silicon; the bit line contact structure is made of one of tungsten, titanium nitride and polycrystalline silicon, or is made of a combination of tungsten, titanium nitride and polycrystalline silicon.

Optionally, the memory structure may further include capacitors; a source of the vertical transistor may be formed above the silicon pillar; a bottom plate of the capacitor may be electrically connected to the source through a conductive connection structure; the capacitors of the memory structure may be in a hexagonal close-packed arrangement.

Optionally, the memory structure may further include a substrate, and the substrate may be P-type doped; when the vertical transistor is the NMOS transistor, the drain may be N-type doped; when the vertical transistor is the PMOS transistor, the drain may be P-type doped, and the substrate and the drain may be isolated by a N-type doped area.

Optionally, the memory structure may further include a substrate, and the substrate may be N-type doped; when the vertical transistor is the NMOS transistor, the drain may be N-type doped, and the substrate and the drain may be isolated by a P-type doped area; when the vertical transistor is the PMOS transistor, the drain may be P-type doped.

In order to solve the above problem, the present disclosure further provides a forming method of a memory structure. The forming method includes: forming m×n silicon pillars arranged in m rows and n columns for subsequent formation of m×n vertical transistors, the rows extend in a first direction and the columns extend in a second direction; forming m bit lines, the bit lines extending in the first direction and electrically connected to drains of all the vertical transistors in a same row, the drains are provided below the silicon pillars; and forming n word lines, the word lines extending in the second direction, located in the middle of the silicon pillars, and serving as gates of all the vertical transistors in a same column, the first direction and the second direction form a non-right angle.

Optionally, an angle between the first direction and the second direction ranges from 45° to 75°.

Optionally, an angle between the first direction and the second direction is 60°.

Optionally, the forming method may further include: forming capacitors above sources of the vertical transistors, the capacitors may be in a hexagonal close-packed arrangement.

In the memory structure and the forming method thereof provided by the present disclosure, the word line direction and the bit line direction are at a non-right angle, which helps to form capacitors in a hexagonal close-packed arrangement in the subsequent production process. This can effectively increase the integration density of the memory structure, reduce the oxide filled between the vertical transistors, and effectively reduce the size of the dynamic random access memory (DRAM).

DETAILED DESCRIPTION

To make the objectives, technical means and effects of the present disclosure clearer, the present disclosure is described in further detail below with reference to the accompanying drawings. It should be understood that the embodiments described herein are merely a part rather than all of the embodiments of the present disclosure, and are not intended to limit the present disclosure. All other embodiments obtained by those of ordinary skill in the art based on the embodiments of the present disclosure without creative efforts should fall within the protection scope of the present disclosure. It should be noted that the size ratio relationship in the accompanying drawings is not the actual size ratio relationship, and is only for illustration.

Figure 1:
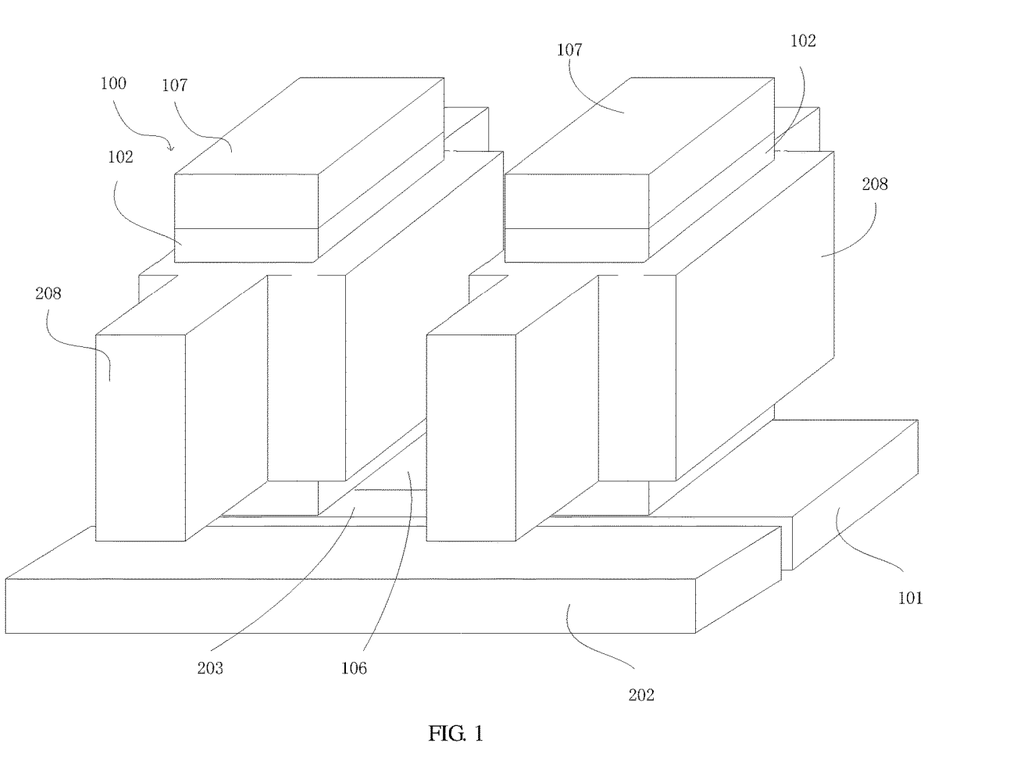
FIG. 1 is a stereoscopic view of a memory structure according to an embodiment of the present disclosure.
Figure 2:
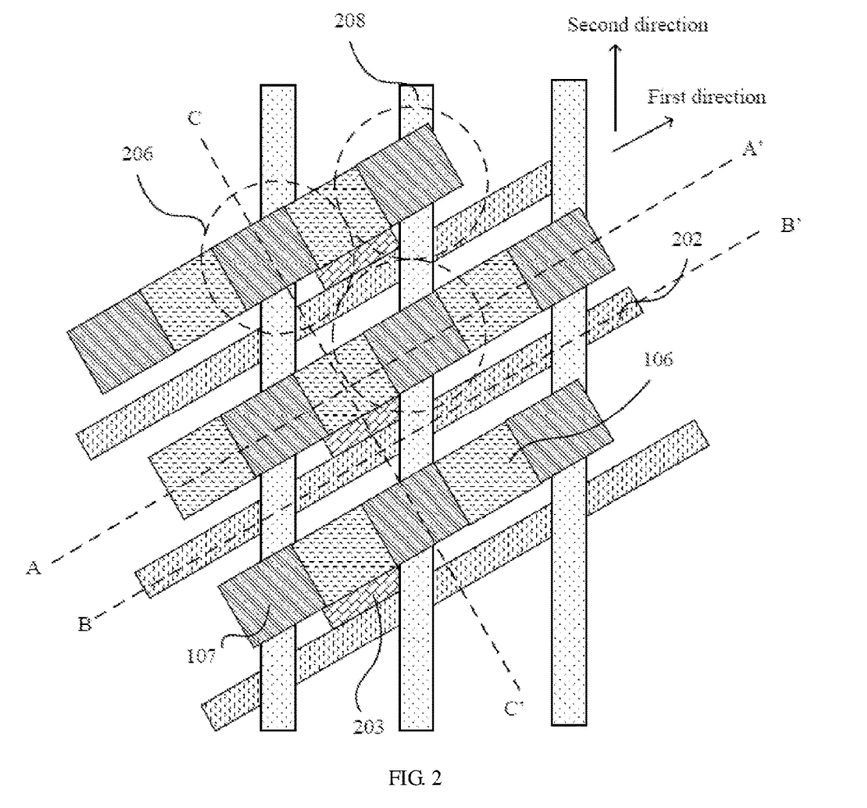
FIG. 2 is a top view of the memory structure according to an embodiment of the present disclosure.

Referring to FIGS. 1 and 2, FIG. 1 is a stereoscopic view of a memory structure according to an embodiment of the present disclosure; FIG. 2 is a top view of the memory structure according to an embodiment of the present disclosure.

As shown in FIG. 1, the embodiment provides a memory structure. The memory structure includes: a plurality of vertical transistors 100, m bit lines 202 and n word lines 208. The vertical transistor includes a silicon pillar 102, and a plurality of silicon pillars 102 are arranged in m rows and n columns. The rows extend in a first direction, and the columns extend in a second direction. The m bit lines 202 extend in the first direction, and are electrically connected to drains 106 of all the vertical transistors in the same row. The drains 106 are located below the silicon pillars 102. The n word lines 208 extend in the second direction, are located in the middle of the silicon pillars 102, and serve as gates of all the vertical transistors 100 in the same column. The first direction and the second direction form a non-right angle.

The rows and columns of the array formed by the vertical transistors 100 of the memory structure in the embodiment shown in FIGS. 1 and 2 are at a non-right angle, which helps to improve the space utilization in the memory structure. By designing the non-right angle, this embodiment can form an array of capacitors 206 in a hexagonal close-packed arrangement in the subsequent production process. Due to the large space utilization of the hexagonal close-packed arrangement, this embodiment can effectively increase the integration density of the memory structure and increase the storage capacity.

In an embodiment, the memory structure includes a substrate 101. The silicon pillar 102 protrudes from an upper surface of the substrate 101. A source 107 of the vertical transistor 100 is formed above the silicon pillar 102. The drain 106 is at least formed below the silicon pillar 102 or inside the substrate 101. The source 107 and the drain 106 are formed by forming specific ion doped regions by ion implantation. The depth of the source 107 and the drain 106 may be controlled by the energy and ion type of ion implantation.

In an embodiment, a bottom plate of the capacitor 206 is electrically connected to the source 107 through a conductive connection structure. The conductive connection structure, the silicon pillar 102 and the capacitor 206 may be located in the same plane projection position. In fact, according to actual arrangement requirements, the conductive connection structure, the silicon pillar and the capacitor may not be located in the same plane projection position, but have a certain deviation.

The source and drain mentioned herein are only the usual names in the dynamic random access memory (DRAM) field, and the names of the source and the drain may also be interchanged without limitation.

Referring to FIG. 2, in the embodiment shown in FIG. 2, the capacitor 206 is formed above the source 107. The capacitor 206 has a cylindrical shape, which is represented by a dotted circle in FIG. 2. In fact, the shape of the capacitor 206 may also be designed according to needs, for example, the capacitor 206 may be designed in a cup shape or a column shape. In FIG. 2, adjacent capacitors 206 are in contact with each other, but in fact, the adjacent capacitors 206 are isolated by an insulating medium. The capacitors 206 in FIG. 2 are only for illustration.

Since the rows and columns of the array formed by the vertical transistors 100 are at a non-right angle, the distance between the columns can be compressed. This embodiment can arrange the capacitors 206 above the sources 107 in the form shown in FIG. 2, thereby improving the arrangement density and achieving the purpose of increasing the storage density. In this embodiment, the size of the memory may be smaller than $4F^2$, where F indicates feature size.

In this embodiment, the silicon pillar 102 serves as an active region of the vertical transistor 100. The word line 208 is formed in the middle of the silicon pillar 102 and serves as the gate of the vertical transistor 100. A gate dielectric layer is formed between the word line 208 and the silicon pillar 102. The gate dielectric layer includes at least one of silicon dioxide, silicon nitride, silicon oxynitride and high-k dielectric. It should be noted that the gate dielectric layer 207 is not shown in FIG. 1.

In an embodiment, in order to reduce a parasitic capacitance between the gate and the source as well as between the gate and the drain, the overlap area between the word line 208 and the source 107 as well as between the word line and the drain 106 is minimized. In fact, due to the limit in the manufacturing process, a large overlap area may occur between the word line 208 and the source 107 or the drain 106.

In an embodiment, the word line 208 is made of one of tungsten, titanium nitride and polycrystalline silicon, or is made of a combination of tungsten, titanium nitride and polycrystalline silicon, and it is formed in the substrate 101 by at least one of chemical vapor deposition (CVD), physical vapor deposition (PVD), or atomic layer deposition (ALD). In this embodiment, the word line 208 serves as a gate, which means that the word line and the gate have the same potential and are formed in the same process using the same material. In another embodiment, the gate and the word line may also be formed separately. For example, the gate is formed first, and then the word line 208 is formed, where the word line 208 is electrically connected to the gate of the vertical transistor 100, and different materials may be used to form the word line 208 and the gate respectively.

In this embodiment, the bit line 202 is formed below the word line 208 and is electrically connected to the drain 106 of the vertical transistor 100 below the silicon pillar 102. In an embodiment, the bit line 202 is electrically connected to the drain 106 through a bit line contact structure 203. The bit line 202 is made of one of tungsten, titanium nitride and polycrystalline silicon, or is made of a combination of tungsten, titanium nitride and polycrystalline silicon. The bit line contact structure 203 is made of one of tungsten, titanium nitride and polycrystalline silicon, or is made of a combination of tungsten, titanium nitride and polycrystalline silicon.

In other embodiments, the bit line 202 may also be formed by the substrate 101. For example, when the vertical transistor 100 is an N-type metal oxide semiconductor (NMOS) transistor and the drain 106 of the vertical transistor 100 is N-type doped, an N-type doped linear region may be formed on the surface of the substrate below the drain 106. The linear region is used to electrically connect the drains 106 of all the vertical transistors 100 in the same column. When the doping type of the substrate 101 is N-type doped, the linear region needs to be electrically isolated from the substrate 101, and the electrical isolation may be achieved by implanting silicon oxide or by a P-type doped region.

In an embodiment, the angle between the first direction and the second direction is 45° to 75°. This angle range can ensure that the area occupied by the capacitor 206 is small. In fact, in a preferred embodiment, the angle between the first direction and the second direction is 60°. In this case, the capacitors 206 of the memory structure formed above the silicon pillars 102 are in a hexagonal close-packed arrangement shown in FIG. 2. Since the space utilization of the hexagonal close-packed arrangement is high, more memory cells can be formed in the same area, thereby increasing the integration density of memory cells of the memory structure.

In this embodiment, the distance between two adjacent silicon pillars 102 is equal, and the centers of any three adjacent silicon pillars 102 form an equilateral triangle. The centers of the capacitors 206 formed above the silicon pillars 102 also form an equilateral triangle, and the capacitors 206 of the memory structure are in a hexagonal close-packed arrangement.

In an embodiment, the vertical transistor 100 is at least one from the group consisting of an NMOS transistor and a PMOS transistor.

When the vertical transistor 100 is an NMOS transistor, the source 107 and the drain 106 of the vertical transistor 100 are doped with N-type ions to form an N-type ion doped region. When the substrate 101 is doped with P-type ions, the drain 106 may directly contact the substrate 101. When the substrate 101 is doped with N-type ions, the drain 106 needs to be isolated from the substrate 101. Specifically, it can be isolated by a P-type doped region or an oxide layer formed by implantation.

When the vertical transistor 100 is a PMOS transistor, the source 107 and the drain 106 are doped with P-type ions to form a P-type ion doped region. When the substrate 101 is doped with N-type ions, the drain 106 may directly contact the substrate 101. When the substrate 101 is doped with P-type ions, the drain 106 needs to be isolated from the substrate 101. It can be isolated by an N-type doped region or an oxide layer formed by implantation.

Referring to FIGS. 3 and 4a to 4g, FIG. 3 is a flowchart of a forming method of a memory structure according to an embodiment of the present disclosure; FIGS. 4a to 4g are sectional views of structures obtained by implementing various steps in the forming method of a memory structure according to an embodiment of the present disclosure. It needs to be noted that FIGS. 4a to 4g are sectional views along A-A' dotted line, B-B' dotted line and C-C' dotted line in FIG. 2.

Figure 3:
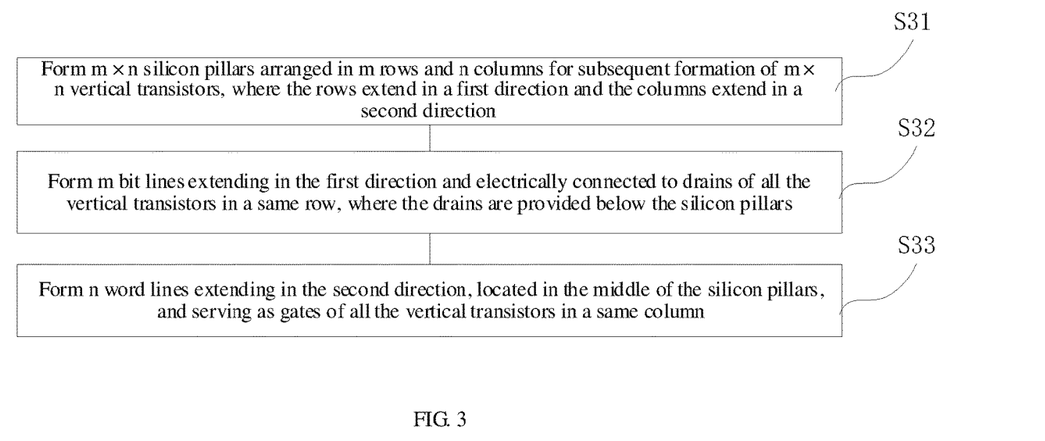
FIG. 3 is a flowchart of a forming method of a memory structure according to an embodiment of the present disclosure.

This embodiment provides a forming method of a memory structure. The forming method includes the following steps. S31: Form m×n silicon pillars 102 arranged in m rows and n columns for subsequent formation of m×n vertical transistors 100, where the rows extend in a first direction and the columns extend in a second direction. S32: Form m bit lines 202 extending in the first direction and electrically connected to drains 106 of all vertical transistors 100 in the same row, where the drains are provided below the silicon pillars 102. S33: Form n word lines 208 extending in the second direction, located in the middle of the silicon pillars, and serving as gates of all the vertical transistors 100 in the same column, where the first direction and the second direction form a non-right angle.

In the forming method of a memory structure provided by this embodiment, the non-right angle between the rows and the columns in the array of the vertical transistors 100 can help to reduce the interval between the capacitors 206 in the subsequent process of forming the capacitors 206, so as to improve the space utilization of the memory structure and increase the integration density of the memory structure.

In an embodiment, the angle between the first direction and the second direction is 45° to 75°. This angle range can ensure that the area occupied by the capacitor 206 is small. In fact, in a preferred embodiment, the angle between the first direction and the second direction is 60°. In this case, the capacitors 206 formed above the silicon pillars 102 are in a hexagonal close-packed arrangement shown in FIG. 2. Since the space utilization of the hexagonal close-packed arrangement is high, more memory cells can be formed in the same area, thereby increasing the integration density of memory cells of the memory structure.

In this embodiment, the distance between two adjacent silicon pillars 102 is equal, and the centers of any three adjacent silicon pillars 102 form an equilateral triangle. The centers of the capacitors 206 formed above the silicon pillars 102 also form an equilateral triangle.

In an embodiment, the forming method further includes: form capacitors 206 above the sources 107 of the vertical transistors 100, where the capacitors 206 are in a hexagonal close-packed arrangement. In this arrangement, the corresponding angle is 60°, which maximizes the space utilization.

Figure 4A:
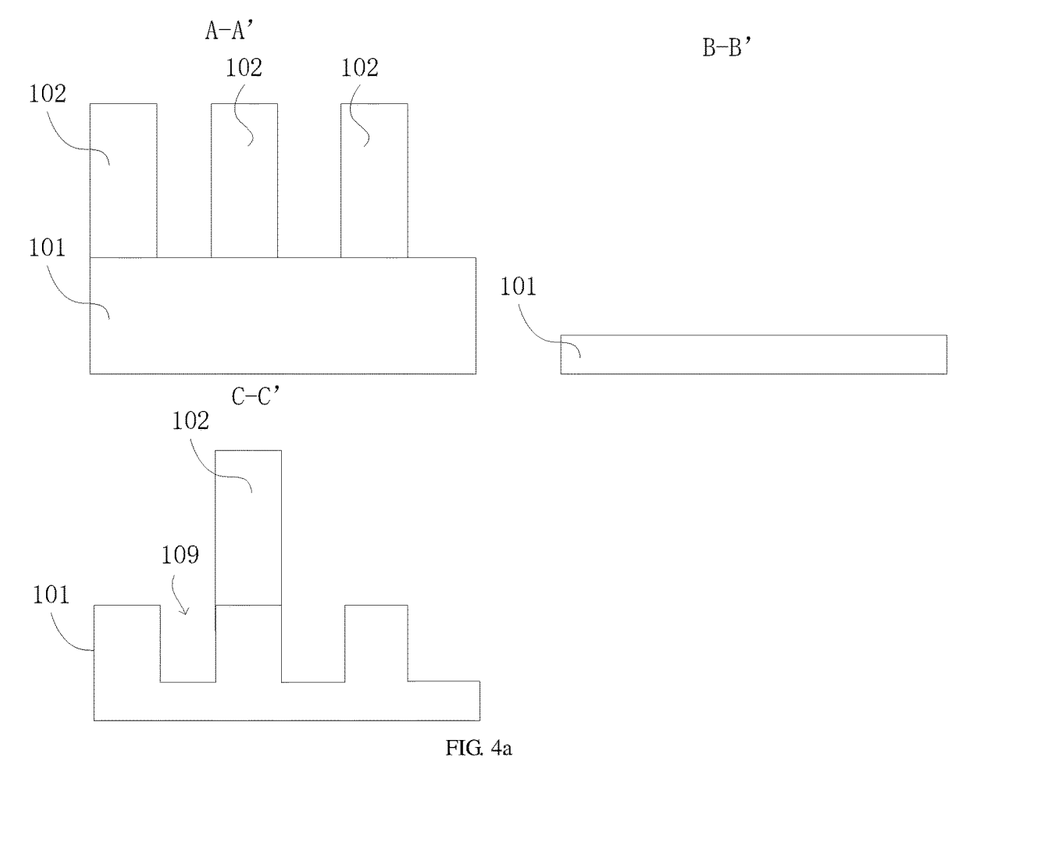
FIGS. 4a to 4g are sectional views of structures obtained by implementing various steps in the forming method of a memory structure according to an embodiment of the present disclosure.

In an embodiment, the vertical transistor 100 is formed as follows. A substrate 101 is provided. Silicon pillars 102 are formed on a surface of the substrate 101. The silicon pillars 102 are arranged in m rows and n columns, where the rows extend in a first direction and the columns extend in a second direction. A first trench 109 is also formed on the surface of the substrate 101, as shown in FIG. 4a. The substrate 101 here is only to distinguish it from the silicon pillar 102. In fact, the silicon pillar 102 may also be a silicon pillar formed after the substrate 101 is etched. An oxide layer 204 is formed in the first trench 109, and a bit line contact structure 203 and a bit line 202 are formed in the oxide layer 204. The bit line contact structure 203 is electrically connected to the drain 106, and the bit line 202 is electrically connected to the bit line contact structure 203, as shown in FIG. 4c. Top surfaces of the oxide layer 204, the bit line contact structure 203 and the bit line 202 are all flush with the top surface of the substrate 101. One of P-type and N-type ions is implanted into the top surface of the silicon pillar 102 to form a source 107, as shown in FIG. 4d. One of P-type and N-type ions is implanted into the upper surface of the substrate 101 between two adjacent silicon pillars 102 to form a drain 106 located between the silicon pillars 102, as shown in FIG. 4d. In this embodiment, the two ion implantations for forming the source 107 and the drain 106 located between the silicon pillars 102 may be performed simultaneously or stepwise. It should be noted that FIGS. 4a to 4g do not show the corresponding structures obtained by implementing the following steps: fill the oxide layer, form the bit line contact structure 203, form the bit line 202, form the source 107 and form the drain 106.

In an embodiment, when the bit line 202 and the bit line contact structure 203 are formed in the first trench 109, an oxide layer of a certain thickness is formed in the first trench 109 first, and then a conductive layer is formed on an upper surface of the oxide layer. An excess of the conductive layer is removed through patterning and etching operations, leaving only the conductive material used to form the bit line contact structure 203 and the bit line 202. In another embodiment, an oxide layer is formed in the first trench 109 first, then a corresponding window is etched on an upper surface of the oxide layer, and the bit line contact structure 203 and the bit line 202 are formed in the window. Those skilled in the art may choose the manufacturing method according to their needs.

It should be noted that in the process of forming the source 107 and the drain 106, the ion doped doping performed is heavy doping. However, in order to improve performance, the entire region of the source 107 may be heavily doped. The upper part of the drain 106 may be lightly doped and the lower part thereof may be heavily doped. Alternatively, the doping concentration in the drain 106 may gradually increase from top to bottom. In this way, this embodiment can reduce the hot carrier effect, and can reduce the parasitic resistance of the drain 106. In addition, the ion doping concentration of the drain 106 located between the silicon pillars 102 is higher than the ion doping concentration of the drain 106 below the silicon pillar. In the embodiment shown in FIGS. 4a to 4g, N-type ion doping is performed to form an N-type ion doped region 205. The doped ions are at least one of P and As ions, and finally an NMOS transistor is formed.

Figure 4B:
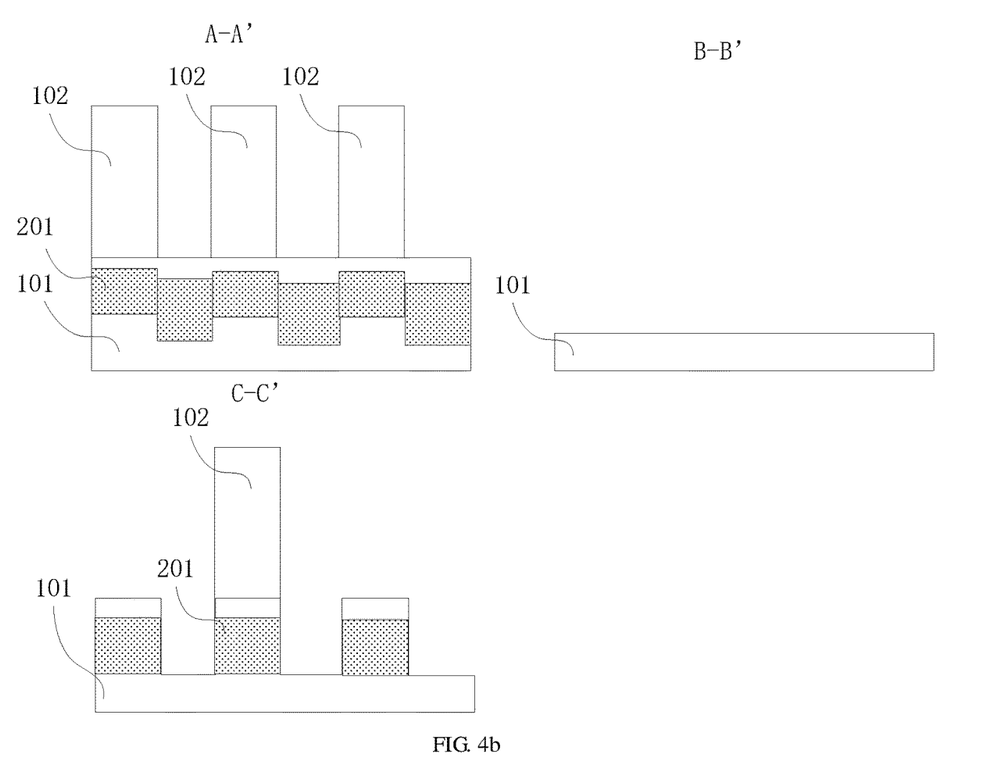
Figure 4C:
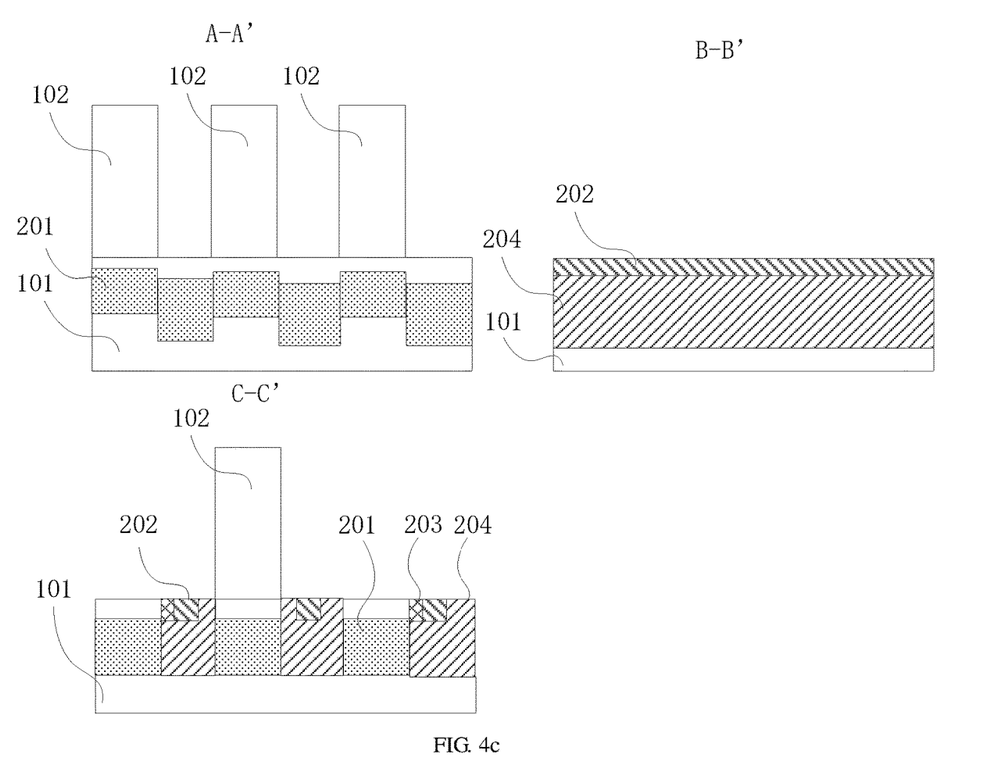
Figure 4D:
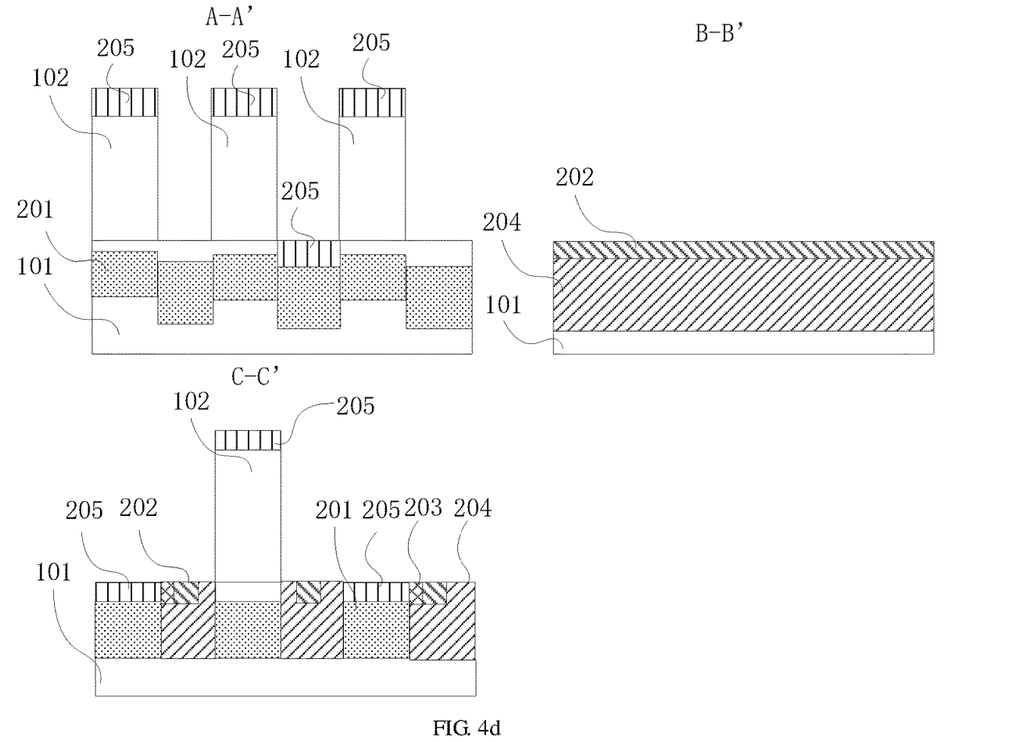

In an embodiment, before forming the source 107 and the drain 106, the forming method further includes: implant one of N-type and P-type ions into the substrate 101, as shown in FIG. 4b. It should be noted that the doping type performed here is opposite to the doping type of the source 107 and the drain 106. In the embodiment shown in FIGS. 4a to 4g, P-type ion doping is performed, and the doped ions may be B ions.

Figure 4E:
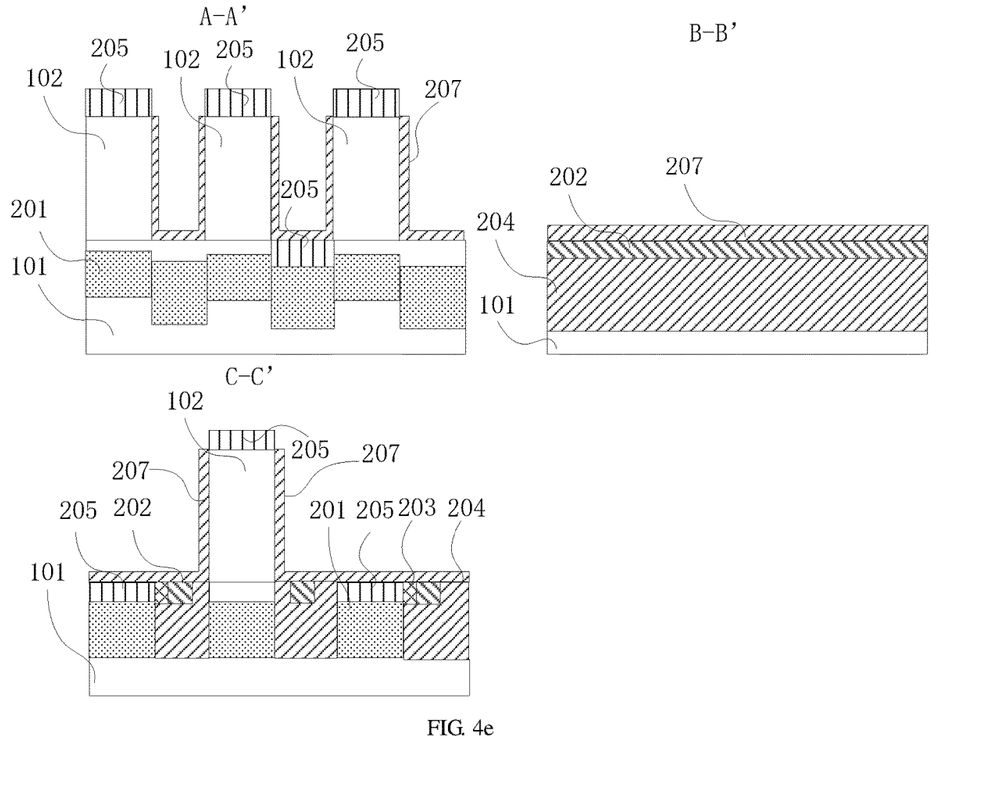
Figure 4F:
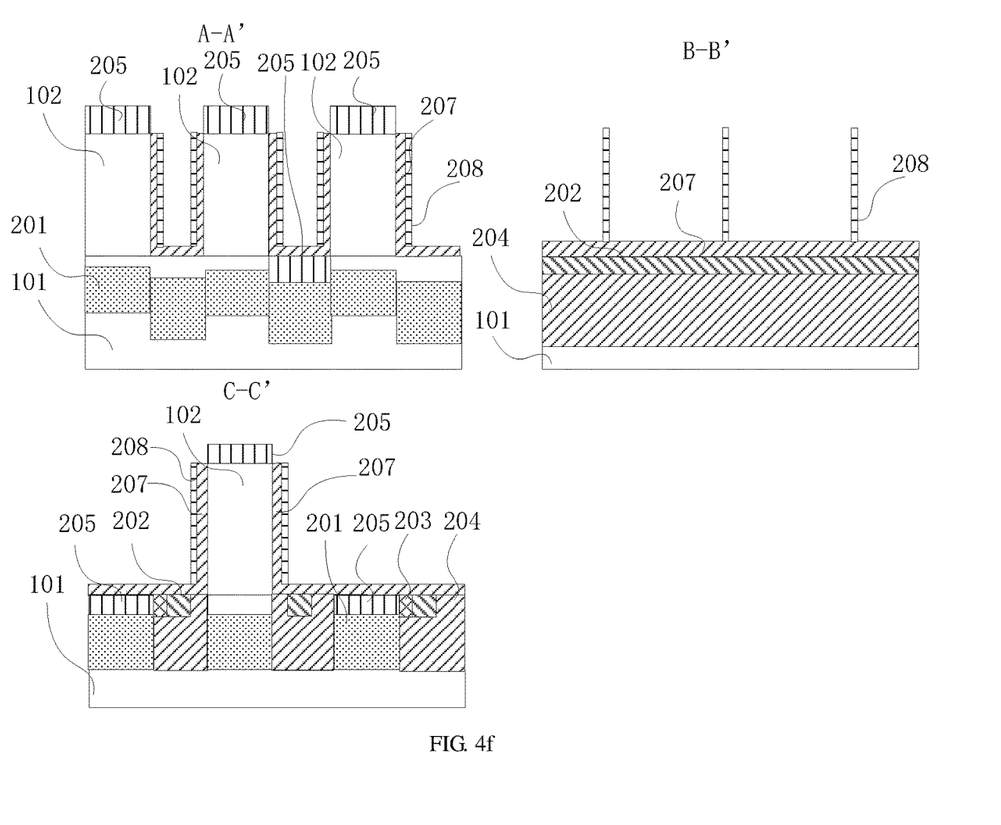

In an embodiment, when the word line 208 is formed, a gate dielectric layer 207 may be formed on a sidewall surface of the silicon pillar 102 first, as shown in FIG. 4e. Then, the word line 208 is formed on a surface of the gate dielectric layer 207 close to the silicon pillar 102, as shown in FIG. 4f.

In an embodiment, the gate dielectric layer 207 includes at least one of silicon oxide, silicon nitride, silicon oxynitride and high-k dielectric. In the embodiment shown in FIGS. 4e, 4f and 4g, the gate dielectric layer 207 is a silicon oxide layer. It should be noted that the gate dielectric layer 207 is not shown in FIG. 1. In an embodiment, after the word line 208 is formed, an insulating layer is filled between the silicon pillars 102. The insulating layer includes at least one of silicon oxide, silicon nitride, silicon oxynitride and high-k dielectric. In the embodiment shown in FIGS. 4e, 4f and 4g, the insulating layer and the gate dielectric layer 207 are made of the same material.

Figure 4G:
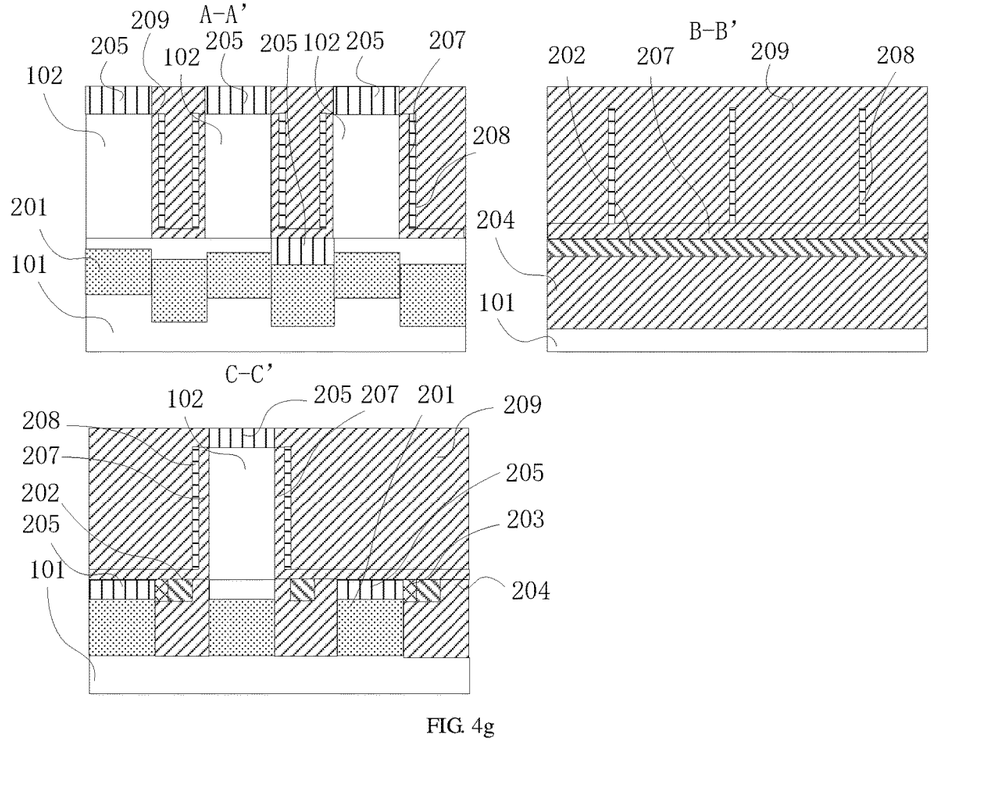

In an embodiment, the word line 208 is made of one of tungsten, titanium nitride and polycrystalline silicon, or is made of a combination of tungsten, titanium nitride and polycrystalline silicon, and it is formed by at least one of CVD, PVD and ALD. The insulating layer 209 is filled between the silicon pillars 102 after the word line 208 is formed. A top surface of the insulating layer 209 is higher than a top surface of the silicon pillar 102 or flush with the top surface of the silicon pillar 102, as shown in FIG. 4g.

In an embodiment, if the top surface of the insulating layer 209 is higher than the top surface of the silicon pillar 102, the top surface of the insulating layer 209 may be subjected to chemical mechanical polishing (CMP) until it is flush with the top surface of the silicon pillar 102.

The above described are merely preferred embodiments of the present disclosure. It should be noted that several improvements and modifications may further be made by those of ordinary skill in the art without departing from the principle of the present disclosure, but such improvements and modifications should also be deemed as falling within the protection scope of the present disclosure.

What is claimed is:

1. A memory structure, comprising:
a plurality of vertical transistors, the vertical transistors comprise silicon pillars; a plurality of the silicon pillars are arranged in m rows and n columns; the rows extend in a first direction and the columns extend in a second direction;
m bit lines, extending in the first direction and electrically connected to drains of all the vertical transistors in a same row, the drains are located below the silicon pillars; and
n word lines, extending in the second direction, located in the middle of the silicon pillars, and serving as gates of all the vertical transistors in a same column;
the first direction and the second direction form a non-right angle.

2. The memory structure according to claim 1, wherein an angle between the first direction and the second direction ranges from 45° to 75°.

3. The memory structure according to claim 1, wherein an angle between the first direction and the second direction is 60°.

4. The memory structure according to claim 1, wherein the vertical transistor comprises at least one of an NMOS transistor and a PMOS transistor.

5. The memory structure according to claim 1, wherein the word line is made of one of tungsten, titanium nitride and polycrystalline silicon, or is made of a combination of tungsten, titanium nitride and polycrystalline silicon.

6. The memory structure according to claim 1, wherein the bit line is electrically connected to the drain through a bit line contact structure; the bit line is made of one of tungsten, titanium nitride and polycrystalline silicon, or is made of a combination of tungsten, titanium nitride and polycrystalline silicon; the bit line contact structure is made of one of tungsten, titanium nitride and polycrystalline silicon, or is made of a combination of tungsten, titanium nitride and polycrystalline silicon.

7. The memory structure according to claim 1, wherein the memory structure further comprises capacitors; a source of the vertical transistor is formed above the silicon pillar; a bottom plate of the capacitor is electrically connected to the source through a conductive connection structure; the capacitors of the memory structure are in a hexagonal close-packed arrangement.

8. The memory structure according to claim 4, wherein the memory structure further comprises a substrate, and the substrate is P-type doped;
when the vertical transistor is the NMOS transistor, the drain is N-type doped;
when the vertical transistor is the PMOS transistor, the drain is P-type doped, and the substrate and the drain are isolated by a N-type doped area.

9. The memory structure according to claim 4, wherein the memory structure further comprises a substrate, and the substrate is N-type doped;

when the vertical transistor is the NMOS transistor, the drain is N-type doped, and the substrate and the drain are isolated by a P-type doped area;

when the vertical transistor is the PMOS transistor, the drain is P-type doped.

10. A forming method of a memory structure, comprising:

forming m×n silicon pillars arranged in m rows and n columns for subsequent formation of m×n vertical transistors, the rows extend in a first direction and the columns extend in a second direction;

forming m bit lines, the bit lines extending in the first direction and electrically connected to drains of all the vertical transistors in a same row, the drains are provided below the silicon pillars; and forming n word lines, the word lines extending in the second direction, located in the middle of the silicon pillars, and serving as gates of all the vertical transistors in a same column;

the first direction and the second direction form a non-right angle.

11. The forming method of a memory structure according to claim 10, wherein an angle between the first direction and the second direction ranges from 45° to 75°.

12. The forming method of a memory structure according to claim 10, wherein an angle between the first direction and the second direction is 60°.

13. The forming method of a memory structure according to claim 10, wherein the forming method further comprises:

forming capacitors above sources of the vertical transistors, the capacitors are in a hexagonal close-packed arrangement.

* * * * *